(12) United States Patent
Trivedi et al.

(10) Patent No.: US 7,727,829 B2
(45) Date of Patent: Jun. 1, 2010

(54) METHOD OF FORMING A SEMICONDUCTOR DEVICE HAVING A REMOVABLE SIDEWALL SPACER

(75) Inventors: Vishal P. Trivedi, Austin, TX (US); Leo Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 589 days.

(21) Appl. No.: 11/671,567

(22) Filed: Feb. 6, 2007

(65) Prior Publication Data

US 2008/0188068 A1    Aug. 7, 2008

(51) Int. Cl.
*H01L 21/336* (2006.01)

(52) U.S. Cl. .................. 438/197; 438/303; 438/305; 257/E21.435

(58) Field of Classification Search .......... 438/197, 438/299, 303, 305; 257/E21.435
See application file for complete search history.

(56) References Cited

U.S. PATENT DOCUMENTS

| 4,837,180 | A | * | 6/1989 | Chao | 438/305 |
| 5,238,859 | A | * | 8/1993 | Kamijo et al. | 438/304 |
| 5,472,895 | A | * | 12/1995 | Park | 438/302 |
| 5,595,919 | A | * | 1/1997 | Pan | 438/302 |
| 6,743,686 | B2 | * | 6/2004 | Lee et al. | 438/303 |
| 6,797,602 | B1 | * | 9/2004 | Kluth et al. | 438/592 |
| 6,972,255 | B2 | * | 12/2005 | Reber et al. | 438/669 |

\* cited by examiner

*Primary Examiner*—Michael Trinh
(74) *Attorney, Agent, or Firm*—Robert L. King; James L. Clingan, Jr.

(57) ABSTRACT

A semiconductor device is formed using a semiconductor substrate. A gate dielectric is formed over the semiconductor substrate. A gate electrode layer is formed over the gate dielectric. A patterned masking layer is formed over the gate electrode layer. A first region of the gate electrode layer lies within an opening in the patterned masking layer. The first region of the gate electrode layer is partially etched to leave an elevated portion of the gate electrode layer and a lower portion adjacent to the elevated portion. A sidewall spacer is formed adjacent to the elevated portion and over the lower portion. An implant is performed into the semiconductor substrate using the elevated portion and the sidewall spacer as a mask. The sidewall spacer and the lower portion are removed.

11 Claims, 5 Drawing Sheets

METHOD OF FORMING A SEMICONDUCTOR DEVICE HAVING A REMOVABLE SIDEWALL SPACER

RELATED APPLICATION

This application is related to our copending U.S. patent application Ser. No. 11/671,748 entitled "Process of Forming An Electronic Device Including Forming A Gate Electrode Layer And Forming A Patterned Masking Layer", filed of even date herewith and assigned to the assignee hereof.

BACKGROUND

1. Field

This disclosure relates generally to semiconductors, and more specifically, to a process for manufacturing a semiconductor data storage device.

2. Related Art

The challenge of forming electronic devices continues to increase as more functionality is put into a smaller area. From a cross-sectional view, the aspect ratio of gate electrode structures continues to increase with successive generations of electronic devices. Taller, thinner structures are more fragile and therefore more likely to be damaged during subsequent processing than structures with a lower aspect ratio or that are thicker. For example, when etching of layers above a source and a drain of a transistor occurs, the etching may remove more material than is desired. For small geometry transistors, the conventional etch processes may actually inadvertently remove portions of a source and a drain when it is desired to only remove an overlying layer of material, such as an overlying gate sidewall spacer. This inadvertent etching of the source and drain results in a pitted transistor structure in which the electrical properties of the transistor structure are significantly degraded. Conventional etch chemistries can readily damage other transistor elements such as undercutting a gate oxide. In addition to altering the electrical integrity of a transistor, gate oxide undercutting can also result in the lifting off of the entire gate structure during subsequent processing. Thus the increased miniaturization of semiconductor dimensions has created additional problems which are not present at larger device geometries.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
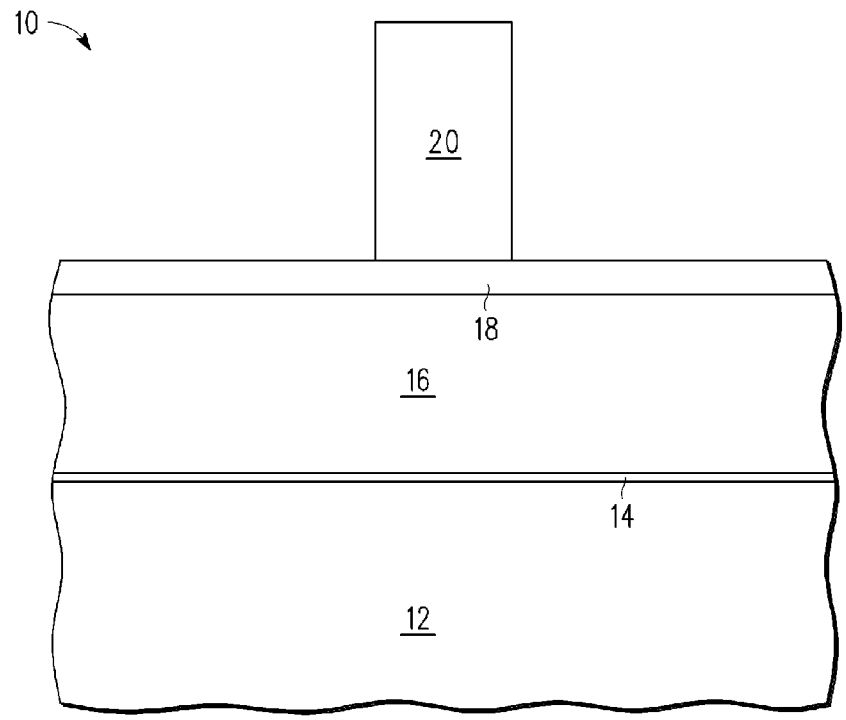
FIGS. 1-13 illustrate in cross-sectional form one form of a method for forming a semiconductor device having a removable sidewall spacer in accordance with the present invention.

Illustrated in FIG. 1 is a cross-sectional view of a process for making a semiconductor device 10. A semiconductor substrate 12 is provided. In one form the semiconductor substrate 12 is a silicon substrate. However, the semiconductor substrate 12 can be any semiconductor material or combinations of materials, such as gallium arsenide, silicon germanium, silicon-on-insulator (SOI), silicon, monocrystalline silicon, the like, and combinations of the above. Overlying the semiconductor substrate 12 is a gate dielectric layer 14. In one form the gate dielectric layer 14 is an oxide such as silicon dioxide and is thermally grown on semiconductor substrate 12 when the semiconductor substrate 12 is silicon. It should be appreciated that the drawings are not necessarily proportioned to size for purposes of explanation. Overlying the gate dielectric layer 14 is a polysilicon layer 16 that is typically formed by deposition in a conventional manner. While polysilicon is discussed it should be readily understood that other semiconductor materials may be used. Overlying the polysilicon layer 16 is a hard mask implemented in the form of an organic ARC (antireflective coating) layer 18. The ARC layer 18 is typically formed by deposition in a conventional manner. Overlying the ARC layer 18 is a patterned photoresist 20. The patterned photoresist 20 is formed conventionally by blanket depositing a photoresist layer and patterning the photoresist material with a mask (not shown) to form the patterned photoresist 20. The patterned photoresist 20 itself functions as a patterned masking layer during subsequent processing.

Figure 2:
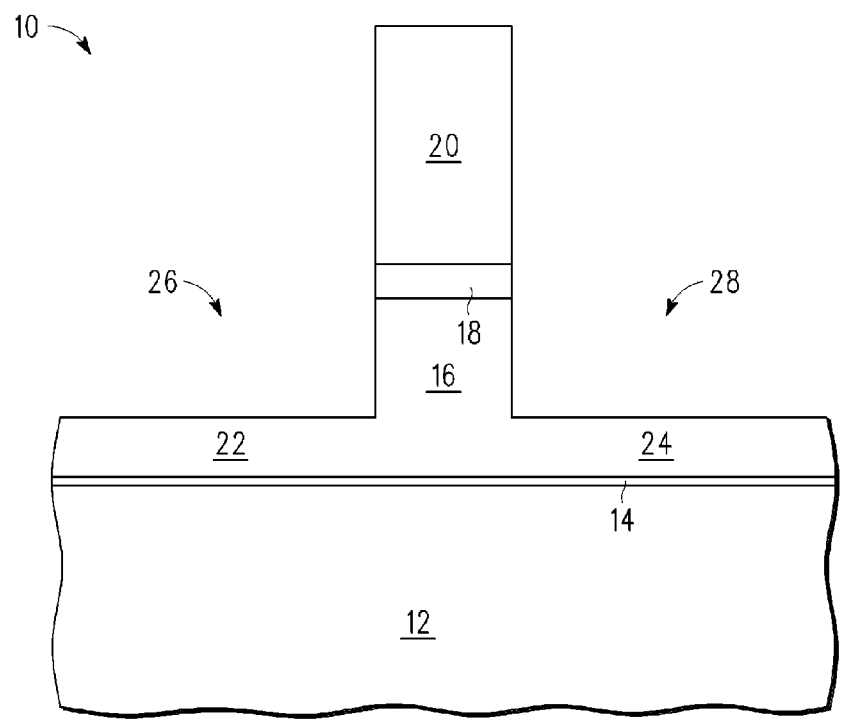

Illustrated in FIG. 2 is a cross-sectional view of semiconductor device 10 wherein a main dry etch using conventional etch chemistries is performed. The dry etch is a conventional etch. In one form, the dry etch process is implemented as a timed etch process. In another form an endpoint marker (not illustrated) may be incorporated into the polysilicon layer 16 and used as an etch stop. The etching forms a removed portion 26 and a removed portion 28 in which all exposed portions of the ARC layer 18 are removed. Separating the removed portion 26 from the removed portion 28 is a gate stack area in which a gate of a transistor will be formed from a portion of polysilicon layer 16. The removed portion 26 and the removed portion 28 are formed, in part, by removing a portion of the polysilicon layer 16. As a result of the etching, an inverse "T" (IT) structure is formed from the polysilicon layer 16. The inverse T structure is formed, in part, of a lower or remaining portion 22 and a lower or remaining portion 24. This inverse "T" structure however will remain temporarily as will be described below and will not become a permanent feature of the semiconductor device. The polysilicon layer 16 functions as a gate electrode layer of a semiconductor device, such as a transistor. The removed portion 26 and removed portion 28 form an opening in which a first region (the masked portion of polysilicon layer 16) of a gate electrode lies within. The opening formed by removed portion 26 and removed portion 28 is typically continuous.

Figure 3:
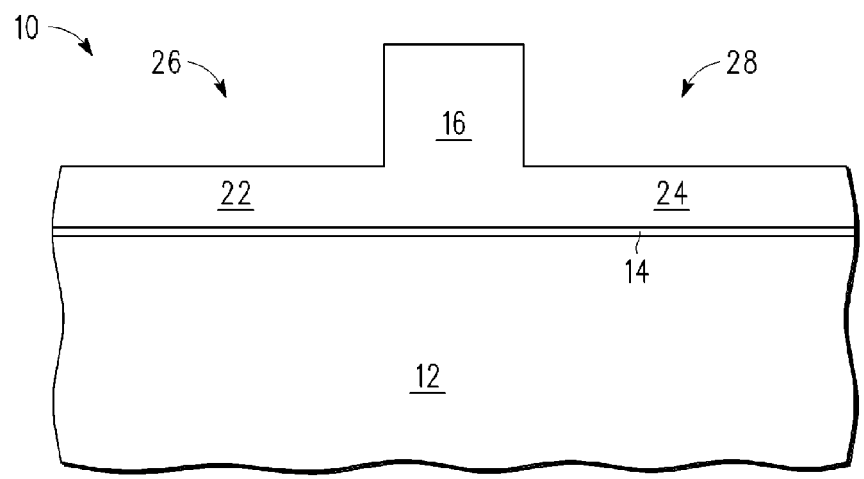

Illustrated in FIG. 3 is a cross-sectional view of semiconductor device 10 wherein remaining portions of the patterned photoresist 20 and the ARC layer 18 are removed. The removal is accomplished for example by exposure to a piranha clean and/or a peroxide dip of the semiconductor device 10. The clean or removal of the remaining photoresist 20 and ARC layer 18 does not modify or degrade the exposed portions 22 and 24 of the polysilicon layer 16. The elevated region of polysilicon layer 16 will be the area in which a gate of a transistor is located. It should be noted that in an alternative form the ARC layer 18 may be left above the polysilicon layer 16 and subsequently removed in connection with FIG. 13 to be described below. If left on semiconductor device 10, the ARC layer 18 will provide additional protection to the portion of the polysilicon layer 16 that is in the gate stack area.

Figure 4:
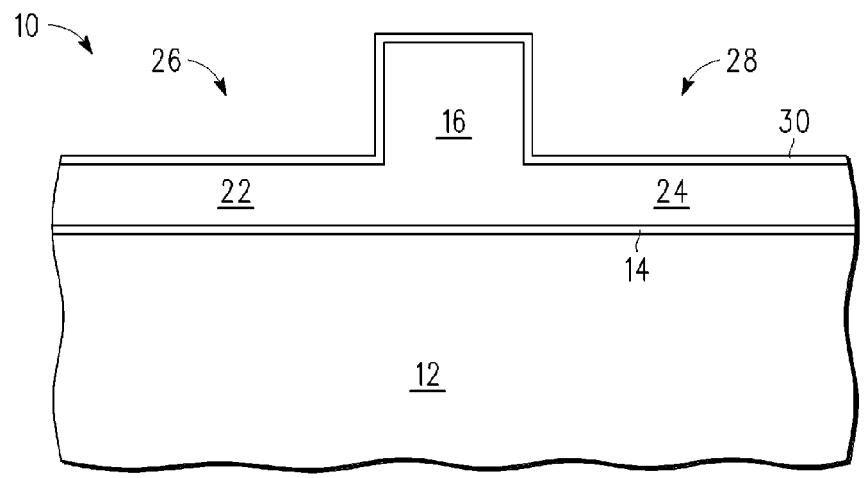

Illustrated in FIG. 4 is a cross-sectional view of semiconductor device 10 wherein a liner 30 is formed overlying all exposed surfaces of the polysilicon layer 16. The liner 30 is a dielectric material and in one form is an oxide such as silicon dioxide ($SiO_2$). The liner 30 may be formed by deposition or by growth techniques that are conventional. The purpose of liner 30 is to provide protection for the underlying polysilicon layer 16 during subsequent processing.

Figure 5:
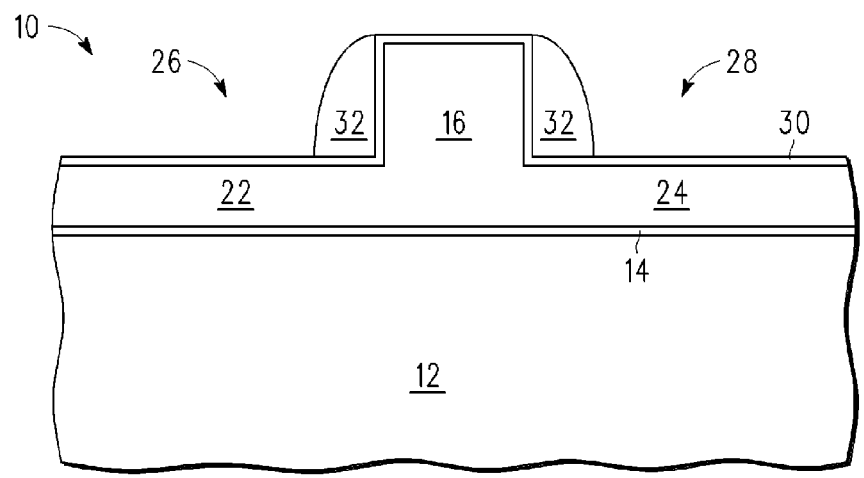

Illustrated in FIG. 5 is a cross-sectional view of semiconductor device 10 wherein a sidewall spacer 32 is formed adjacent the vertical sides of the polysilicon layer 16. The sidewall spacers are disposable or removable sidewall spacers. In one form the sidewall spacer 32 is formed of silicon nitride. Alternatively, the sidewall spacer 32 is formed of silicon dioxide ($SiO_2$) or other known spacer materials. Other conventional materials may be used to implement the sidewall spacer 32. Formation of the sidewall spacer material is conventional and will be described in detail. A deposition of the sidewall spacer material onto all exposed surfaces of the liner 30 occurs. Subsequently, an anisotropic etch of the sidewall spacer material occurs which removes the sidewall spacer material everywhere on semiconductor device 10 but along the vertical sides of polysilicon layer 16.

Figure 6:
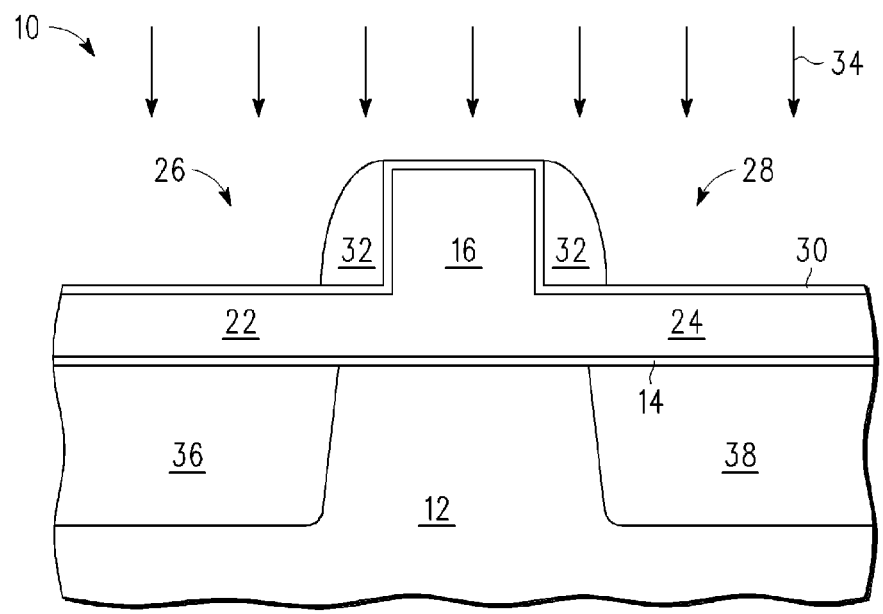

Illustrated in FIG. 6 is a cross-sectional view of semiconductor device 10 wherein an ion implant 34 is performed on semiconductor device 10. If an N-channel transistor is desired to be formed a phosphorous implant is performed. If a P-channel transistor is desired to be formed a boron implant is performed. While ion implant 34 is represented as being orthogonal to the semiconductor device 10, an angled implant from the left, from the right, or both, may alternatively be implemented. The result of the ion implant 34 is to form a deep source 36 and a deep drain 38 within the semiconductor substrate 12 in areas that are not underlying the elevated portion of the polysilicon layer 16 and its adjoining sidewall spacer 32. It should be noted that a portion of the deep source 36 and the deep drain 38 migrates to underlie the sidewall spacer 32.

Figure 7:
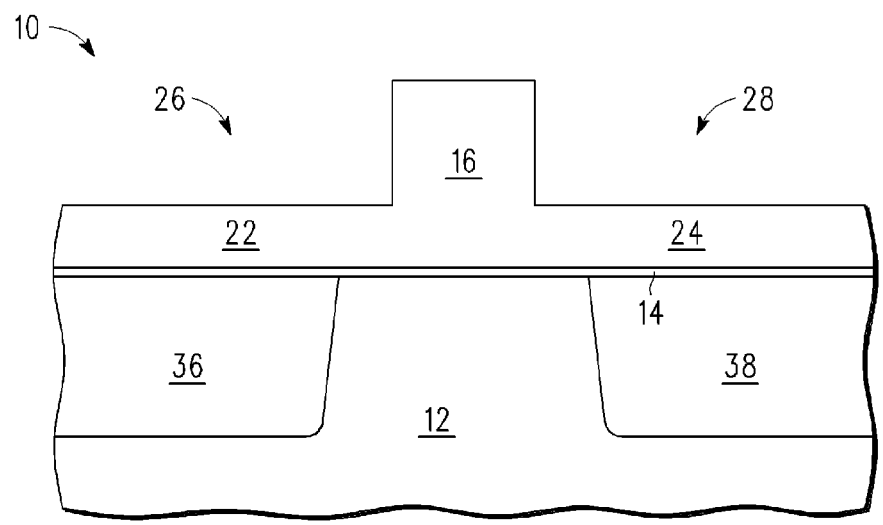

Illustrated in FIG. 7 is a cross-sectional view of semiconductor device 10 wherein the sidewall spacer 32 is removed using a conventional wet etch. Another conventional wet etch is subsequently utilized to remove the liner 30. It should be understood that both of these wet etches are selected to polysilicon layer 16. Therefore substantially none of the polysilicon layer 16 is reduced in height or width.

Figure 8:
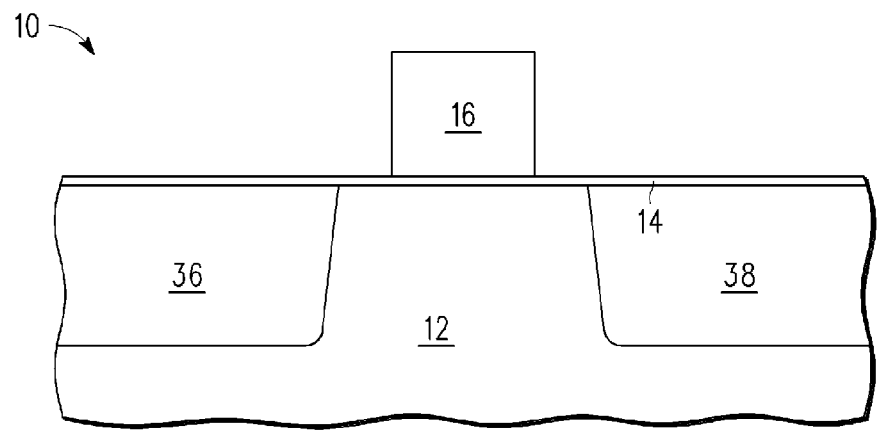

Illustrated in FIG. 8 is a cross-sectional view of semiconductor device 10 wherein exposed portions of the polysilicon layer 16 are etched. In other words, the remaining portions 22 and 24 are removed at this point. The exposed portion of polysilicon layer 16 is reduced in height by an amount equal to the thickness of portions 22 and 24 that were removed. This etch is a conventional dry etch which stops accurately on the gate dielectric layer 14 and does not damage the gate dielectric layer 14. At this point in the method, a gate electrode is formed from the polysilicon layer 16. The gate electrode overlies the gate dielectric layer 14 which has not been degraded from the prior processing. It should be noted that the height of the gate portion of polysilicon layer 16 will not be reduced if the ARC layer 18 is still present as described above.

Figure 9:
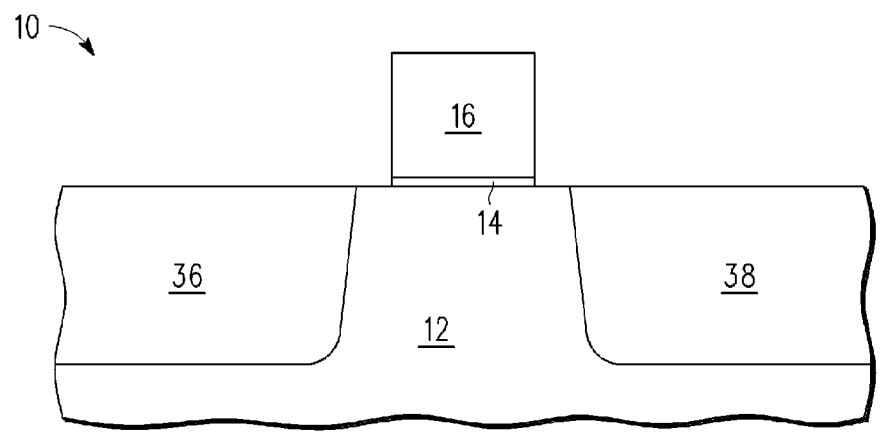

Illustrated in FIG. 9 is a cross-sectional view of semiconductor device 10 wherein a conventional clean step is performed to remove the exposed portions of the gate dielectric layer 14. It should be noted that in the dry etch performed in connection with FIG. 8, in another form both the remaining portions 22 and 24 and the subsequently exposed gate dielectric layer 14 are all removed. In this form the dry etch stops on semiconductor substrate 12 rather than on the gate dielectric layer 14 as explained immediately above. Additionally in FIG. 9, an anneal step or a first thermal budget is implemented. The anneal step is a high temperature anneal and is of sufficient duration to further diffuse the implanted ions with the semiconductor substrate 12. As a result the deep source 36 and the deep drain 38 are of more depth and somewhat closer to underlying the gate of polysilicon layer 16 than in FIG. 8 prior to the annealing. In one form, the anneal process is implemented as a conventional spike anneal process which is an enhanced rapid thermal anneal (RTA) process.

Figure 10:
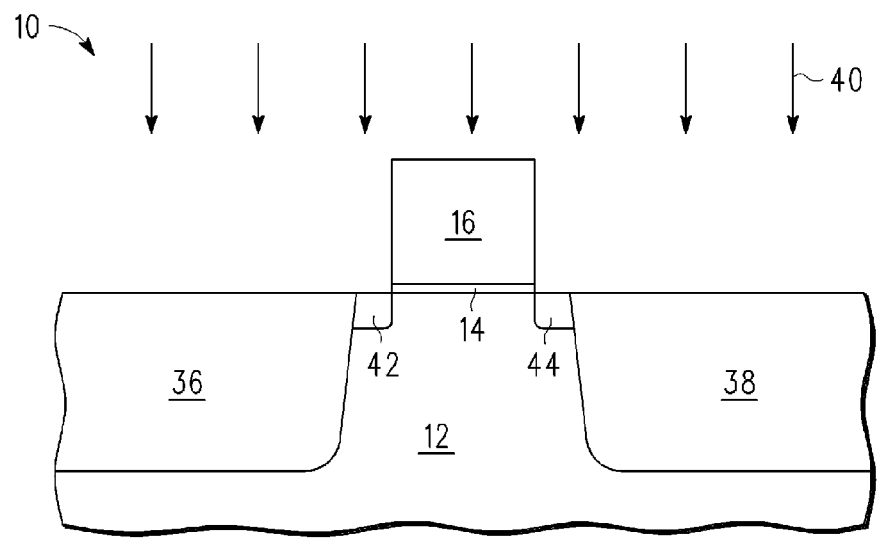

Illustrated in FIG. 10 is a cross-sectional view of semiconductor device 10 wherein an ion implant 40 is performed. It should be understood that the ion implant 40 may be implemented as a single implant or a series of implants that utilize multiple differing types of implant types such as a halo implant. The type of implant chemistry is dependent again on whether an N-channel transistor or a P-channel transistor is desired to be formed. If an N-channel transistor is desired, an arsenic (As) implant is used. If a P-channel transistor is desired, a boron fluorine ($BF_2$) implant is used. However, it should be understood that other implant chemistries may be used if desired. The ion implant 40 results in the formation of an extension implant 42 between the gate and deep source 36 and an extension implant 44 between the gate and deep drain 38. The ion implant also penetrates the polysilicon layer 16 but this increases the conductivity of the gate which is beneficial. In the event that the ARC layer 18 is still present above the gate, the ARC layer 18 would block the additional ions from entering the gate material of polysilicon layer 16.

Figure 11:
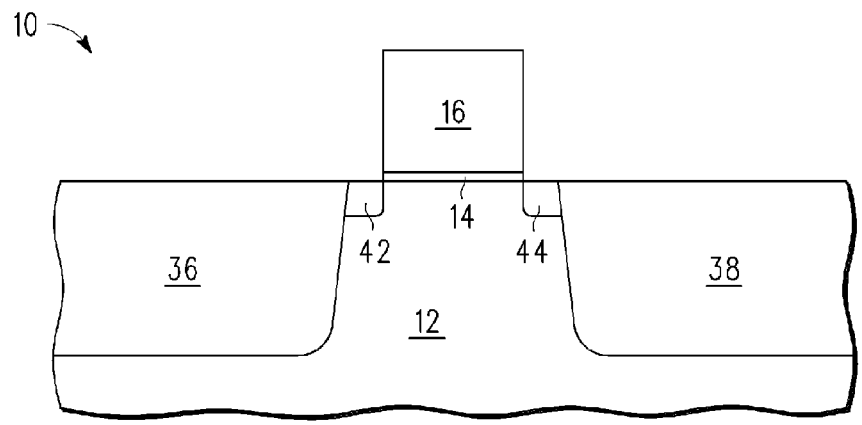

Illustrated in FIG. 11 is a cross-sectional view of semiconductor device 10 wherein another anneal is performed to thermally activate the extension implant 42 and the extension implant 44. It should be noted that this anneal is separate and distinct from the anneal processing that is used to activate the deep source/drain regions of deep source 36 and deep drain 38. The anneal that is required for the extension implants 42 and 44 is not very long compared to the anneal for the deep source 36 and deep drain 38. A long anneal cycle time or thermal budget for the shallower extension implant 42 and extension implant 44 would result in the implant being driven significantly into the transistor's channel region and detrimentally altering the channel's electrical parameters. By using the separate anneal thermal budgets, an optimal placement of the shallow implant regions is more likely. In one form, the anneal used to activate the extension implant 42 and the extension implant 44 is performed by a laser anneal for a few milliseconds.

Figure 12:
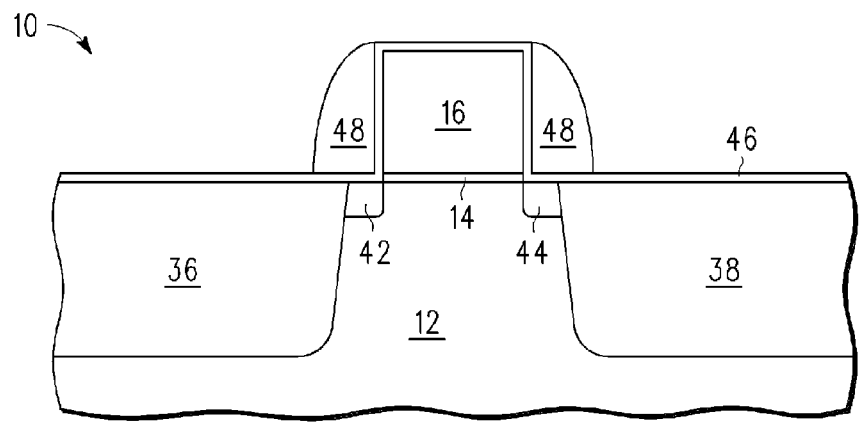

Illustrated in FIG. 12 is a cross-sectional view of semiconductor device 10 wherein further processing is performed. A spacer liner 46 is deposited onto all exposed surfaces of semiconductor device 10 that was illustrated in FIG. 11. The spacer liner 46 is a dielectric. In one form the spacer liner 46 is formed of silicon dioxide ($SiO_2$) or another oxide material. A sidewall spacer 48 is formed by conventional sidewall spacer techniques. Briefly, a layer of sidewall material, such as silicon nitride, is deposited on all surfaces of the spacer liner 46 and then a conventional anisotropic etch process is performed to form sidewall spacer 48 from the remaining sidewall spacer material. The sidewall spacer 48 functions to insure that subsequently formed silicide contacts on the deep source 36 and the deep drain 38 do not make electrical contact with the extension implant 42 and the extension implant 44.

Figure 13:
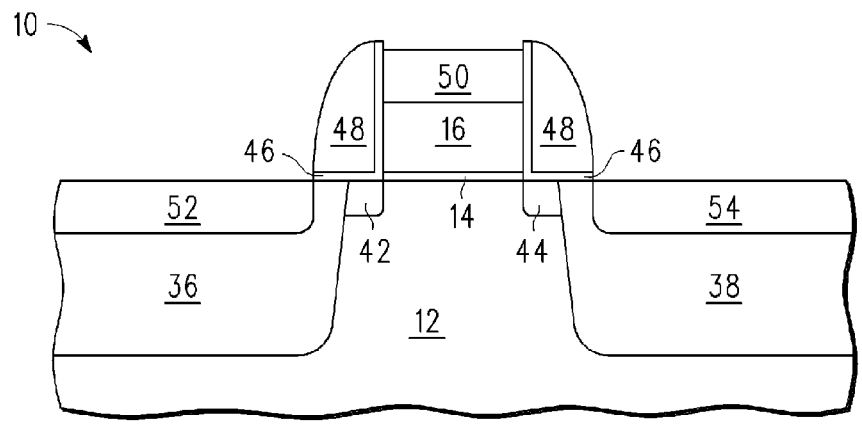

Illustrated in FIG. 13 is a cross-sectional view of further processing of semiconductor device 10 to form a completed transistor. The exposed portions of spacer liner 46 are removed by a conventional wet etch. If the ARC layer 18 or gate cap from FIG. 2 was not previously removed as illustrated in FIG. 3, the ARC layer 18 has remained overlying the gate portion of polysilicon layer 16 during all of the steps described to this point. However, if the ARC layer 18 is still present over polysilicon layer 16, the ARC layer 18 is removed by dry etching at this point in the processing. With the ARC layer 18 removed, the dry etching may consume a small portion of the upper surface of the polysilicon material of polysilicon layer 16 and a small portion of exposed surfaces of sidewall spacer 48. At this point in the processing, the upper surfaces of polysilicon layer 16, the deep source 36 and the deep drain 38 are exposed. A conventional silicide process step is performed to create silicide region 50 overlying polysilicon layer 16, silicide region 52 overlying deep source 36 and silicide region 54 overlying deep drain 38. The silicide regions 50, 52 and 54 provide regions for electrical contact to the gate, source and drain of the formed transistor.

By now it should be appreciated that there has been provided a method for forming a semiconductor device, such as a transistor, having a removable sidewall spacer and a temporary inverse "T" or IT structure. The method described herein provides accurately controlled transistor gate features and good profiles for source/drain extension regions and source/drain regions. The method described herein also permits aggressive etch chemistries and clean chemistries to be used even for very small sized features, such as features of multiple nanometers. It should be noted also that the gate structure formed herein is mechanically stable during the entire method.

In one form there is herein provided a method of forming a semiconductor device using a semiconductor substrate. A gate dielectric is formed over the semiconductor substrate. A gate electrode layer is formed over the gate dielectric. A patterned masking layer is formed over the gate electrode layer, wherein a first region of the gate electrode layer lies within an opening in the patterned masking layer. The first region of the gate electrode layer is partially etched to leave an elevated portion of the gate electrode layer and a lower portion adjacent to the elevated portion. A sidewall spacer is formed adjacent to the elevated portion and over the lower portion. An implant into the semiconductor substrate is performed and the elevated portion and the sidewall spacer are used as a mask. The sidewall spacer is removed. The lower portion is removed.

In another form the patterned masking layer is removed prior to forming the sidewall spacer. In yet another form removing the lower portion is further characterized by reducing a height of the elevated portion. In another form a liner is formed over the elevated portion and the lower portion prior to step of performing the implant. In one form the step of performing the implant forms a doped region in the substrate. A second sidewall spacer is formed adjacent to the elevated portion after the step of removing the lower portion. A silicide layer is formed on a top portion of the doped region.

In another form an organic anti-reflective coating is formed over the gate electrode layer prior to forming the patterned masking layer. The step of partially etching includes removing the organic anti-reflective coating over the first region of the gate electrode. In another form the step of performing the implant forms a first doped region in the substrate. The first doped region is annealed. A second implant is performed. After the step of removing the sidewall spacer and after the step of annealing the first doped region, the elevated portion is used as a mask to form a second doped region in the substrate, wherein the second doped region is shallower than the first doped region. In another form a second sidewall spacer is formed, after the step of performing the second implant, adjacent to the elevated portion. A silicide layer is formed on a top portion of the first doped region. In one form silicide is formed by forming a silicide layer on a top portion of the elevated portion. In yet another form a liner is formed adjacent to the elevated portion prior to forming the second sidewall spacer.

In another form there is provided a method of forming a semiconductor device using a semiconductor substrate. A gate dielectric is formed over the substrate. A polysilicon layer over the gate dielectric. A mask is formed over the polysilicon layer. The polysilicon layer is etched using the mask to remove portions of the polysilicon layer to leave a gate structure of polysilicon and a lower portion of polysilicon adjacent to the gate structure. A sidewall spacer is formed on the lower portion and adjacent to the gate structure. An implant is performed through the lower portion using the sidewall spacer as a mask to form a first source/drain region in the substrate spaced laterally from the gate structure. The sidewall spacer is removed. The lower portion is removed and the first source/drain region is heated. An implant is performed into the substrate, after the step of heating the first source/drain region, using the gate structure as a mask to form a source/drain extension region in the substrate laterally adjacent to the gate structure. The source/drain extension region is heated.

In yet another form the step of heating the source/drain extension region is implemented by laser annealing. In another form the step of implanting through the lower portion is performed by implanting phosphorus. The step of implanting into the substrate is performed by implanting arsenic. In another form the step of removing the lower portion reduces a height of the gate structure. A second sidewall spacer is formed adjacent to the gate structure after the step of heating the first source/drain region. Silicide is formed in a top portion of the first source/drain region after forming the step of forming the second sidewall spacer. In another form a liner is formed on a side of the gate structure and on the lower portion prior to forming the sidewall spacer.

In yet another form there is herein provided a method of forming a semiconductor device using a semiconductor substrate. A structure is formed over the substrate and has a gate material having a lower portion and an elevated portion above the lower portion. A sidewall spacer is formed adjacent to the elevated portion. A first dose of ions is implanted into the substrate using the sidewall spacer and the elevated portion as a mask. The sidewall spacer and the lower portion are removed. A second dose of ions are implanted into the substrate using the gate structure as a mask, wherein the implanting with the second dose is shallower than the implanting with the first dose. In another form two separate heating steps are performed, one between the steps of implanting and the other after the step of implanting with a second dose. In another form implanting with a first dose is done by implanting phosphorus and implanting with a second dose is done by implanting arsenic. In a further form a liner is formed adjacent to the elevated portion prior to the step of forming the sidewall spacer. A gate dielectric is formed over the substrate prior to the step of forming the structure. A second sidewall spacer is formed adjacent to the elevated portion after the step of implanting the second dose. Siliciding is implemented after the step of forming the second sidewall spacer. In a further form the sidewall spacer is a nitride sidewall spacer. A spike anneal is implemented after the step of implanting with the first dose and before the step of implanting with the second dose. A laser anneal is performed after the step of implanting with the second dose.

Although the invention has been described with respect to specific conductivity types or polarity of potentials, skilled artisans appreciated that conductivity types and polarities of potentials may be reversed. Moreover, the terms "front," "back," "top," "bottom," "over," "under", "above", "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the method may be used to form other semiconductor devices in addition to transistors. For example diodes and fuses may be implemented using this method. Also, various semiconductor materials may be used in addition to the materials specifically listed herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a semiconductor device using a semiconductor substrate, comprising:
    forming a gate dielectric over the semiconductor substrate;
    forming a gate electrode layer over the gate dielectric;
    forming a patterned masking layer over the gate electrode layer, wherein a first region of the gate electrode layer lies within an opening in the patterned masking layer;
    partially etching the first region of the gate electrode layer to form a polysilicon inverse "T" structure from the gate electrode layer and leave an elevated portion of the gate electrode layer forming a gate structure and a lower portion adjacent to the elevated portion;
    forming a sidewall spacer adjacent to the elevated portion and over the lower portion;
    performing an implant into the semiconductor substrate using the elevated portion and the sidewall spacer as a mask to form a first source/drain region;
    removing the sidewall spacer to expose the polysilicon inverse "T" structure;
    removing the lower portion;
    heating the first source/drain region;
    implanting into the semiconductor substrate, after the step of heating the first source/drain region, using the gate structure as a mask to form a source/drain extension region in the substrate laterally adjacent to the gate structure; and
    heating the source/drain extension region.

2. The method of claim 1, further comprising removing the patterned masking layer prior to forming the sidewall spacer.

3. The method of claim 1, wherein the step of removing the lower portion is further characterized by reducing a height of the elevated portion.

4. The method of claim 1 further comprising:
    forming a dielectric material liner over the elevated portion and the lower portion prior to performing the implant for providing protection to the polysilicon inverse "T" structure.

5. The method of claim 1, wherein the step of performing the implant forms a doped region in the semiconductor substrate, further comprising:
    forming a second sidewall spacer adjacent to the elevated portion after the step of removing the lower portion; and
    forming a silicide layer on a top portion of the doped region.

6. The method of claim 1, further comprising:
    forming an organic anti-reflective coating over the gate electrode layer prior to forming the patterned masking layer;
    wherein the step of partially etching includes removing the organic anti-reflective coating over the first region of the gate electrode layer.

7. A method of forming a semiconductor device using a semiconductor substrate, comprising:
    forming a gate dielectric over the semiconductor substrate;
    forming a polysilicon layer over the gate dielectric;
    forming a mask over the polysilicon layer;
    etching the polysilicon layer using the mask to remove portions of the polysilicon layer to form a polysilicon inverse "T" structure having a gate structure of polysilicon and a lower portion of polysilicon adjacent to the gate structure;
    forming aسidewall spacer on the lower portion and adjacent to the gate structure;
    implanting through the lower portion using the sidewall spacer as a mask to form a first source/drain region in the semiconductor substrate spaced laterally from the gate structure;
    removing the sidewall spacer to expose the polysilicon inverse "T" structure;
    removing the lower portion of polysilicon;
    heating the first source/drain region;
    implanting into the semiconductor substrate, after the step of heating the first source/drain region, using the gate structure as a mask to form a source/drain extension region in the substrate laterally adjacent to the gate structure; and
    heating the source/drain extension region.

8. The method of claim 7, wherein the step of heating the source/drain extension region comprises laser annealing.

9. The method of claim 7, wherein:
    the step of implanting through the lower portion comprises implanting phosphorus; and
    the step of implanting into the semiconductor substrate comprises implanting arsenic.

10. The method of claim 7, wherein the step of removing the lower portion reduces a height of the gate structure, further comprising:
    forming a second sidewall spacer adjacent to the gate structure after the step of heating the first source/drain region; and
    forming silicide in a top portion of the first source/drain region after forming the step of forming the second sidewall spacer.

11. The method of claim 7, forming a liner on a side of the gate structure and on the lower portion prior to forming the sidewall spacer.

* * * * *